United States Patent [19]
Kawashima

[11] Patent Number: 6,082,293
[45] Date of Patent: Jul. 4, 2000

[54] PLASMA SOURCE

[75] Inventor: Toshitaka Kawashima, Kanagawa, Japan

[73] Assignee: Sony Corporation, Tokyo, Japan

[21] Appl. No.: 08/840,877

[22] Filed: Apr. 17, 1997

[30] Foreign Application Priority Data

Apr. 18, 1996 [JP] Japan .............................. P08-119496

[51] Int. Cl.[7] .............................. C23C 16/00; C23F 1/02
[52] U.S. Cl. ............. 118/723 E; 156/345; 118/723 MW
[58] Field of Search ................... 118/723 MW, 118/723 ME, 723 MA, 723 MR, 723 I, 723 IR, 723 AN, 723 E, 723 ER; 156/345; 315/111.41, 111.51

[56] References Cited

U.S. PATENT DOCUMENTS

| | | | |
|---|---|---|---|
| 4,740,268 | 4/1988 | Bukhman .................................. | 156/643 |
| 4,947,085 | 8/1990 | Nakanishi et al. .................. | 315/111.41 |
| 5,431,769 | 7/1995 | Kisakibaru et al. ..................... | 156/345 |
| 5,527,394 | 6/1996 | Heinrich et al. ..................... | 118/723 E |

*Primary Examiner*—Thi Dang
*Assistant Examiner*—Luz Alejandro
*Attorney, Agent, or Firm*—Hill & Simpson

[57] ABSTRACT

According to the present invention, when power is supplied from a high frequency power supply to an antenna 14, a quasi-electrostatic induced electric field $E_{PS}$ is generated in a chamber 11, and plasma P of high density is generated over a broad area. Further, an alternating current (frequency: several tens Hz to several tens KHz) flows in polyphase AC magnets 17 by a polyphase AC inverter power supply, whereby a horizontal magnetic field (magnetic flux density B) is generated on a semiconductor wafer 13. The magnetic field thus generated rotates at the rotational number corresponding to the frequency which is set in the polyphase AC inverter power supply, and the rotation of the magnetic field causes a rotating electric field E to occur on the surface of the semiconductor wafer 13. In a surface area of the semiconductor wafer 13, an electric field $E_V$ (plasma sheath electric field $E_{sheath}$) is generated in the vertical direction while an electric field $E_H$ obtained by adding the rotating electric field $E_{MAG}$ to the induced electric field $E_{PS}$ generated by the antenna 14 is generated in the horizontal direction, so that the composite electric field $E_C$ of the electric field $E_H$ and the electric field $E_V$ is generated at a desired angle to the surface of the semiconductor wafer 13.

11 Claims, 6 Drawing Sheets

PLASMA SOURCE

BACKGROUND OF THE INVENTION

1. Field of the Invention

The present invention relates to a plasma source for processing an object to be processed (hereinafter referred to as "process target") such as a semiconductor wafer or the like by using plasma, and particularly to a plasma source having a controller for controlling the velocity and direction (vector-control) of constituent particles of plasma such as ions, electrons, radicals (neutral activated elements) or the like in plasma.

2. Description of the Related Art

For example, a plasma CVD (Chemical Vapor Deposition) method, a plasma RIE (Reactive Ion Etching) method, a sputtering method, etc. are known as a processing method using plasma in a semiconductor process. According to these methods, predetermined plasma is produced in a processing chamber while an object (semiconductor wafer) is disposed in the processing chamber, a film is formed on the process target or an etching treatment is performed on the process target by action of plasma constituent particles such as ions, electrons or the like.

Various methods for producing plasma have been hitherto practically used for the above types of plasma sources. At present, new plasma sources for obtaining high-density and uniform plasma under a low process gas pressure have been increasingly studied and developed as disclosed by H. Hara, et al. "Proc. Workshop on Industrial plasma Applications" ISPC-9, 1, pp 62–69 (1989, Italy). However, with these plasma sources, it is impossible to perform the control of the velocity and moving direction of the plasma constituent particles such as reaction gas, ions or the like, and these plasma sources are based on one-dimensional control which is performed on wafers by adjusting a process gas pressure, a plasma potential based on input power, a thermal motion direction, an acceleration of particles in the direction perpendicular to the surface of the semiconductor wafer based on a bias electric field or the like. That is, from a point view of the vector control of plasma, it is the present situation that no vector control is performed by the present plasma sources.

Therefore, the control in the direction perpendicular to the surface of the process target can be performed, that is, the film thickness, the etching depth, etc. on the surface of the process target can be controlled, however, it is difficult to perform the control in the other directions than the direction perpendicular to the surface of the process target. Therefore, the present plasma sources are not suitably applicable to a process for a complicated structure. Accordingly, the conventional plasma sources cannot perform sufficient control in such a process that a trench groove, a Via hole, a contact hole or the like in a semiconductor device is tapered, or in such a process that an oxide film having a desired thickness is coated on the inner surface of the trench groove or the like, and this is a critical problem in a complicated processing work.

Further, a technique for flattening the wafer surface in a wiring process is being increasingly indispensable for the future trends of the micromachining of semiconductor wiring patterns. At present, A CMP (Chemical and Mechanical Polishing) technique is considered for the flattening process. However, a technique for directly and three-dimensionally forming a film into narrow and deep Via holes, trench grooves, contact holes, etc. in a film forming process will be required in the future. However, it is the present situation that the CMP-based method have various problems to be solved, such as productivity, management of dust, contamination, water-proof, and future micromachining.

In view of the foregoing problems, the applicant has invented a novel plasma processing method which can perform plasma control in directions other than the direction perpendicular to the surface of the process target of ions, electrons or the like in plasma, and also perform complicated etching, processing and other works.

According to this method, an electric field is generated in a direction perpendicular to the surface of a process target (semiconductor wafer), and also an electric field is generated in a horizontal direction to the surface, whereby the direction of ions, electrons or the like in plasma is controlled on the basis of the composite electric field of these vertical and horizontal electric fields. This method will be described in detail with reference to FIG. 1.

As shown in FIG. 1, this method controls the moving direction of ions or electrons in plasma 103 generated in a space between an upper electrode 101 and a lower electrode 102 which are disposed in a processing chamber 100. In order to perform the above plasma control, both an electric field $E_V$ which is vertical to the surface of a process target 104 such as a semiconductor wafer or the like (hereinafter referred to as "vertical electric field $E_V$") and an electric field $E_H$ which is parallel (horizontal) to the surface of the process object 104 (hereinafter referred to as "horizontal electric field $E_H$"), are generated simultaneously and combined with each other in a predetermined ratio to generate a composite electric field Ec, and the velocity and moving direction of the ions or electrons in the plasma 103 are controlled by using the composite electric field Ec.

The vertical electric field $E_V$ comprises a plasma sheath electric field which naturally occurs on the surface of the process target 104, a DC bias electric field generated by DC bias 105 applied to the lower electrode 102, and a radio frequency bias electric field generated by radio-frequency bias 106 of 13.56 MHz, for example. Further, the horizontal electric field $E_H$ comprises an induced electric field which is generated, for example, by disposing a pair of coils so that the coils confront both the side portions of the process target 104, supplying an alternating current having a predetermined period into the coils from a single-phase ac power supply to generate a magnetic field in the direction parallel (horizontal) to the surface of the process target 104, and periodically reversing the direction of the magnetic field, whereby the induced electric field is generated so as to surround these magnetic fields.

As described above, according to the previously-proposed plasma control method, the moving direction of ions, electrons or the like in the plasma 103 can be controlled by using the composite electric field Ec comprising the vertical electric field $E_V$ and the horizontal electric field $E_H$. However, in this method, the vertical electric field $E_V$ is still larger than the horizontal electric field $E_H$ because the vertical electric field is generated on the surface of the process target 104 by the DC bias 105 or radio-frequency bias 106. Therefore, it is difficult to obtain a sufficiently large horizontal electric field $E_H$, so that the controllability of the composite electric field, that is, the controllability of the velocity and direction of ions, electrons or the like cannot be sufficiently achieved.

OBJECTS AND SUMMARY OF THE INVENTION

Therefore, an object of the present invention is to provide a plasma source which can provide a sufficiently large horizontal electric field on the surface of a process target to thereby control the velocity and direction of plasma constituent particles such as ions, electrons or the like in plasma with high precision, and facilitate a complicated processing work using plasma.

A plasma source according to the present invention includes plasma generating means for generating an induced electric field from the outside of a processing chamber for performing a plasma treatment into the inside of the processing chamber, thereby generating plasma, horizontal electric field generating means for generating an electric field in a horizontal direction to the surface of a process target in the plasma generated by the plasma generating means, and control means for controlling the horizontal electric field generated by the horizontal electric field generating means to control the velocity and direction of plasma constituent particles in the plasma.

According to the plasma source, the induced electric field directing from the outside of the processing chamber to the inside of the processing chamber is generated through an electrodeless discharge process of the plasma generating means, whereby plasma is generated in the processing chamber. The electric field in the horizontal direction to the surface of the process target is generated by the horizontal electric field generating means under the plasma atmosphere generated by the plasma generating means. The control means controls the horizontal electric field generated by the horizontal electric field generating means to vary the intensity and direction of the composite electric field comprising the horizontal electric field and the electric field in the vertical direction to the surface of the process target (plasma sheath electric field), whereby the velocity and moving direction of the plasma constituent particles such as ions or the like in the plasma can be controlled. Here, the electric field in the vertical direction to the surface of the process target (i.e., the vertical electric field) comprises only the plasma sheath electric field which is generated at the interface with the process target by the plasma itself. Accordingly, the rate of the intensity of the horizontal electric field to the intensity of the vertical electric field is increased.

According to the plasma source of the present invention, the induced electric field is generated in the direction from the outside of the processing chamber to the inside of the processing chamber by the electrodeless discharge, and also the horizontal electric field is generated on the surface of the process target in the plasma. The velocity and moving direction of the plasma constituent particles such as ions or the like are controlled by controlling the horizontal electric field, so that the electric field in the vertical direction to the process target comprises only the plasma sheath electric field which is generated at the interface with the process target by the plasma itself which is generated by the electrodeless discharge. Therefore, the horizontal electric field having relatively large intensity can be obtained. Accordingly, the intensity and direction of the composite electric field of the horizontal and vertical electric fields, that is, the velocity and moving direction of the plasma constituent particles such as ions or the like in the plasma can be controlled with high precision. Particularly, the present invention is more effectively and precisely applicable to the vector control for the flattening process of the surface of a semiconductor wafers, the film formation process or etching process in trench grooves, Via holes or contact holes, further an angle control process of the inner walls of trench grooves or the like. Therefore, the present invention enables a complicated processing work which meets the requirements for performing the micromachining of semiconductor devices.

DETAILED DESCRIPTION OF THE PREFERRED EMBODIMENTS

Preferred embodiments according to the present invention will be described with reference to the accompanying drawings.

Figure 1:
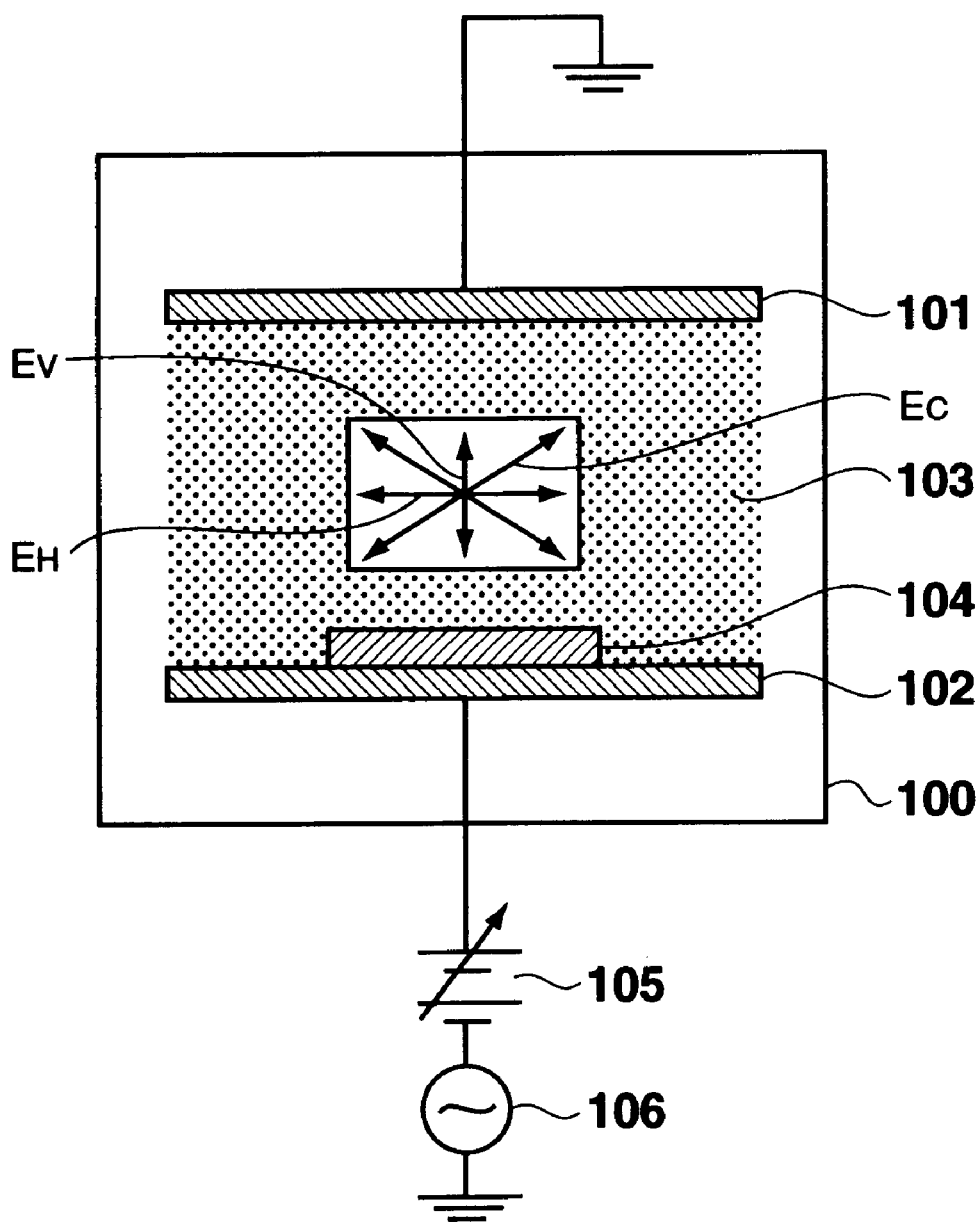
FIG. 1 is a diagram showing the construction of a plasma source which was previously invented by the applicant.
Figure 2:
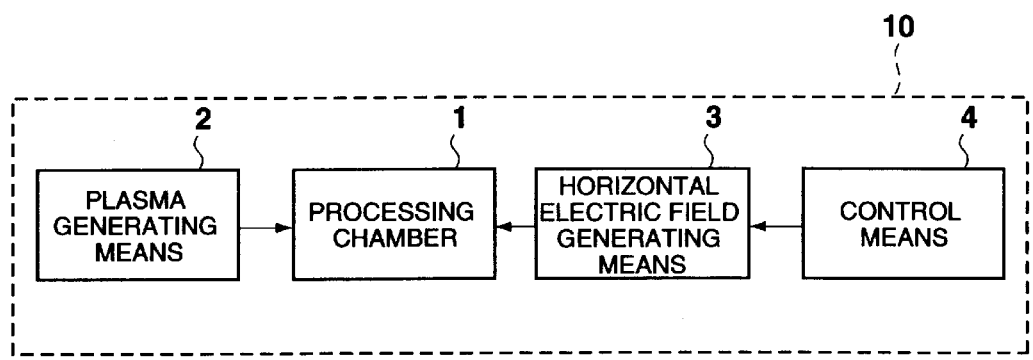
FIG. 2 is a diagram showing the functional construction of a plasma source according to a first embodiment of the present invention.

FIG. 2 shows the functional construction of a plasma source 10 according to a first embodiment of the present invention. That is, the plasma source 10 comprises a processing chamber 1 in which a process target (an objected to be processed) is mounted, plasma generating means 2 for generating an induced electric field in the processing chamber from the outside of the processing chamber 1 to generate plasma, horizontal electric field generating means 3 for generating an electric field in a horizontal direction to the surface of the process target in the plasma generated by the plasma generating means 2, and control means 4 for controlling the horizontal electric field generated by the horizontal electric field generating means 3 to control the intensity and direction of the composite electric field of the horizontal electric field and an electric field in the vertical direction to the surface of the process target, thereby controlling the velocity and direction of plasma constituent particles such as ions or the like in the plasma.

The first embodiment utilizes as the plasma generating means 2 a method for generating an induced electric field through an electrodeless discharge process using a discharging means (antenna) as the plasma generating means 2, and also as the horizontal electric field generating means 3 a method for inducing a horizontal rotating electric field with a rotating magnetic field. Further, the control means 4 controls the frequency of the rotation of the rotating electric field.

Figure 3:
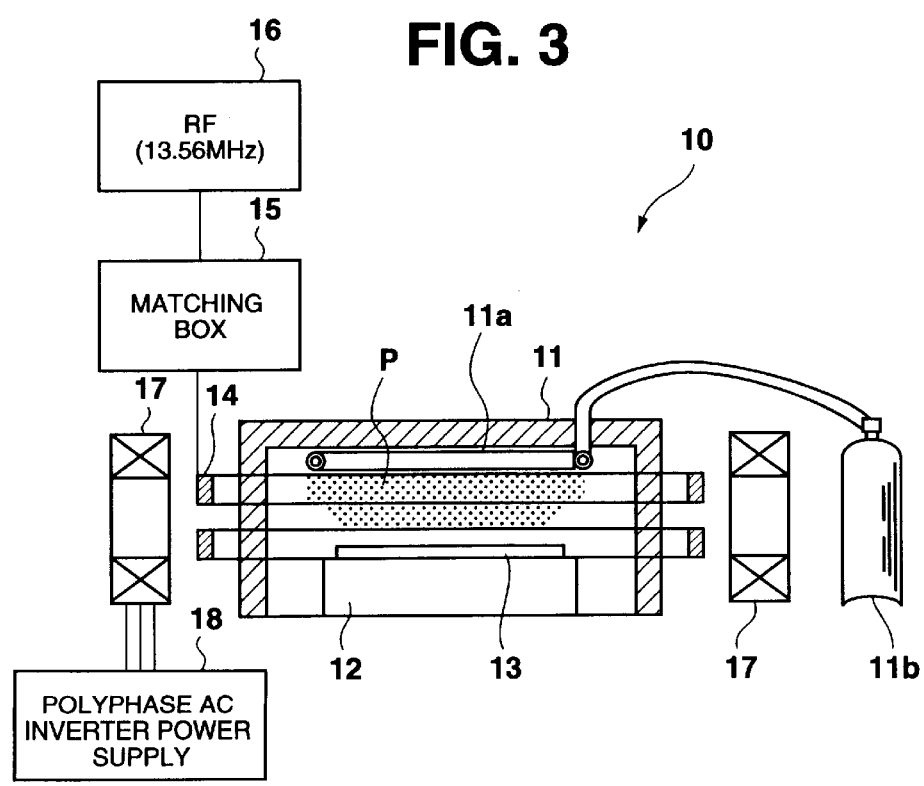
FIG. 3 is a diagram showing the construction of the plasma source shown in FIG. 2.
Figure 4:
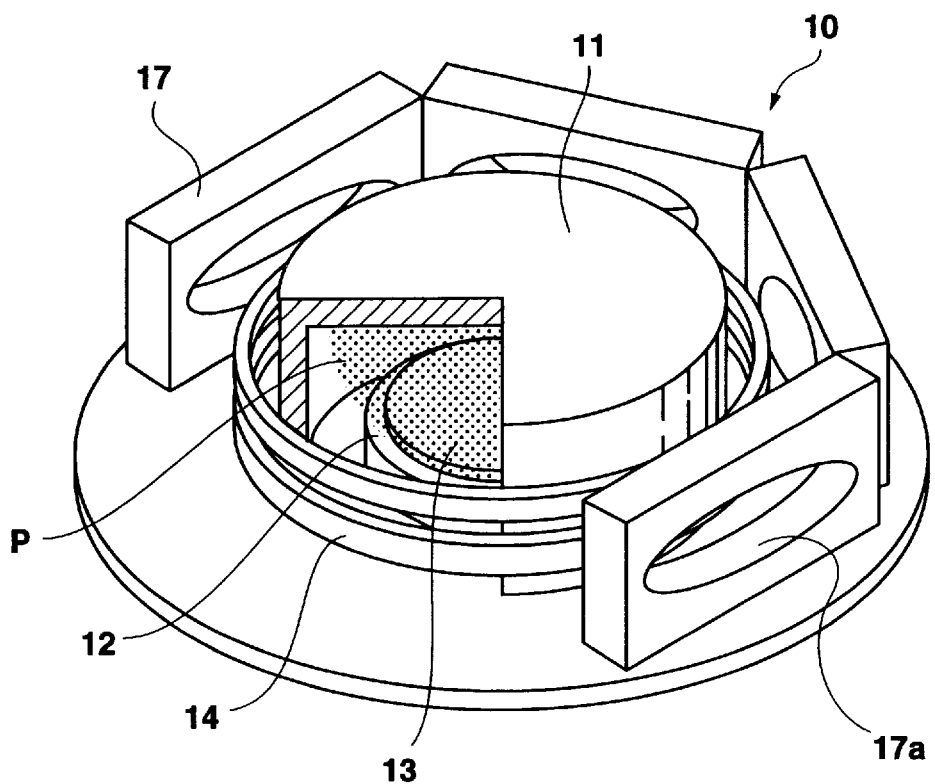
FIG. 4 is a perspective view showing the construction of a main part of the plasma source shown in FIG. 3, which is illustrated as being partially broken.

FIG. 3 shows the construction of the plasma source 10, and FIG. 4 shows the outlook of a main part of the plasma source 10, which is illustrated as being partially broken.

That is, the plasma source 10 of this embodiment has a cylindrical chamber (reacting vessel) 11 formed of quartz as the processing chamber 1, for example. The inside of the chamber 11 is evacuated and kept under a high vacuum state by exhausting means (pump) (not shown). A gas ring 11a for supplying process gas is provided in the chamber 11. A wafer holder 12 is also provided in the chamber 11 so that a semiconductor wafer 13 is mounted as a process target on the wafer holder 12.

Figure 5:
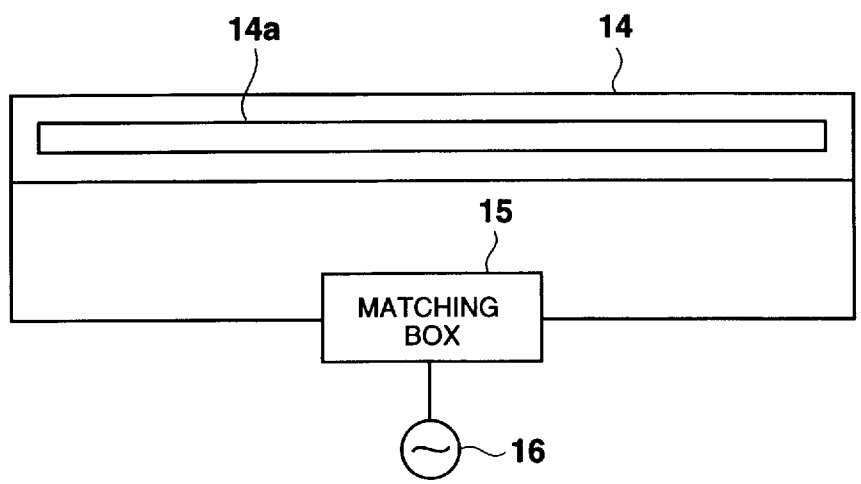
FIG. 5 is a side view showing the construction of an antenna used in the plasma source shown in FIG. 3.

Further, a process gas bomb 11b which is linked to the gas ring 11a in the chamber 11 is provided at the outside of the chamber 11 so that process gas in the process gas bomb 11b is supplied through the gas ring 11a into the chamber 11. In addition, an antenna 14 is disposed around the chamber 11. The antenna 14 is formed of copper or other materials, and it is designed in a ring shape along the outer peripheral portion of the chamber 11. The antenna 14 is formed with a slit 14a which serves as a passage for magnetic field as described later and formed along the longitudinal direction of the antenna as illustrated as being developed in FIG. 5. The antenna 14 is connected through a matching circuit (matching box) 15 to a radio-frequency power supply (RF) (for example, frequency: 13.56 MHz) 16. The antenna is supplied with power from the radio frequency power supply 16 to induce discharge in the chamber 11 from the outside of the chamber 11, whereby an induced electric field is induced in the chamber 11 to generate plasma P. The antenna 14, the matching circuit 15 and the radio-frequency power supply 16 constitute the plasma generating means 2 shown in FIG. 2.

Along the peripheral portion of the antenna 14 are further provided polyphase AC magnets 17 for generating an electric field in a direction parallel (horizontal) to the surface of the semiconductor wafer 13 in the chamber 11. Each of the polyphase AC magnets 17 is formed with an opening 17a serving as a passage for magnetic field as described later so that the opening is faced to the slit 14a of the antenna 14. The polyphase AC magnets 17 are connected to a polyphase AC inverter power supply 18 so that polyphase (for example, three-phase) alternating current flows into the polyphase magnets 17. The polyphase alternating magnets 17 and the polyphase inverter power supply 18 constitute the horizontal electric field generating means 3 shown in FIG. 2. That is, a pseudo magnetic field (magnetic flux density B) in the horizontal direction is generated on the surface of the semiconductor wafer 13 by supplying alternating current into the polyphase AC magnets 17, and then a rotating magnetic field is generated by rotating the magnetic field. That is, the horizontal rotating electric field is induced by the rotating magnetic field.

Next, the operation of the plasma source 10 according to this embodiment will be described.

First, plasma P is generated in the chamber 11 by the plasma generating means 2 using the antenna 14. That is, representing the inductance of the antenna 14 by $L_i$ (henry) and representing the antenna current by $I \cos \omega t$ ($\omega$: angular frequency), a voltage of $\omega L_i I \cos \omega t$ is applied to the antenna 14, whereby quasi-electrostatic induced electric field $E_{PS}$ is generated in the chamber 11 to generate rare plasma. Further, power injection into plasma by the antenna 14 is highly efficiently performed with the aid of the induced electric field $E_{PS}$, so that high-density plasma P can be generated over a broad area in the chamber 11.

Figure 6:
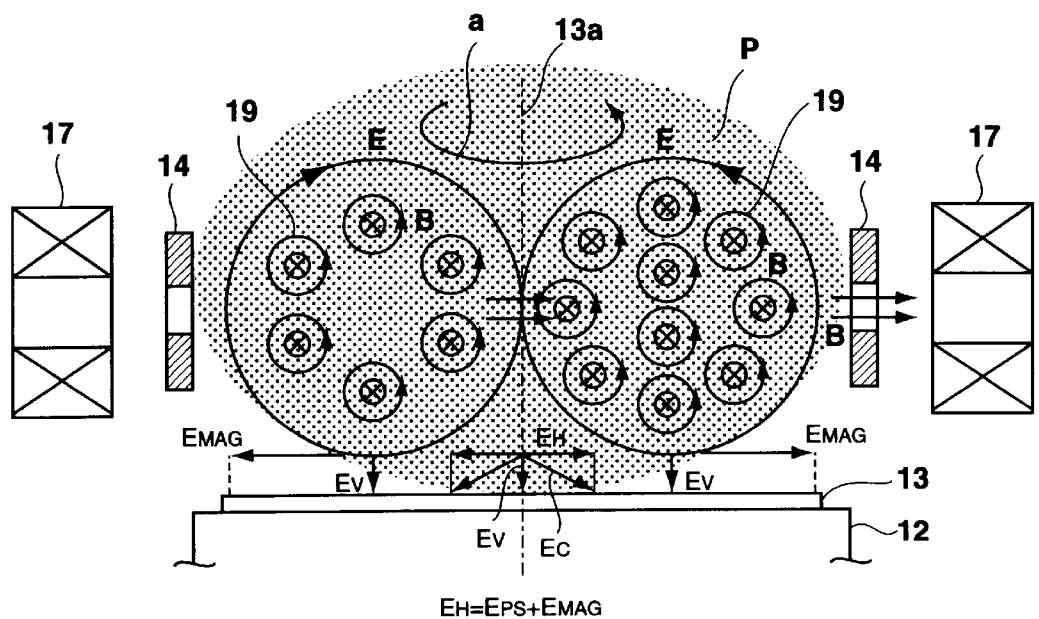
FIG. 6 is a schematic diagram showing generation of an electric field by the plasma source shown in FIG. 3.

Subsequently, a rotating electric field which rotates in the horizontal direction around the axis perpendicular to the surface of the semiconductor wafer 13 in the plasma P is generated by the horizontal electric field generating means 3. That is, the frequency of the polyphase AC inverter power supply 18 is set to about several tens Hz to several tens KHz, and the alternating current is supplied into the polyphase AC magnets 17. In this case, as schematically shown in FIG. 6, the magnetic field (magnetic flux density B) is generated in the horizontal direction on the semiconductor wafer 13. Here, it is assumed that the right side on the semiconductor wafer 13 is set as the front side in the moving direction of the magnetic field and the left side on the semiconductor wafer 13 is set as the rear side in the moving direction of the magnetic field. In this case, the magnetic flux density B is dense at the front side of the magnetic field, whereas the magnetic flux density B is sparse at the rear side of the magnetic field. However, according to the electromagnetic induction law, the magnetic flux is varied so as to reduce the magnetic flux density at the front side of the magnetic field and increase the magnetic flux density at the rear side of the magnetic field. That is, the increase/reduction direction of the magnetic flux is different between the front and rear sides of the magnetic field, and in this state the magnetic field rotates around the axis 13a vertical to the surface of the semiconductor wafer 13 in accordance with the frequency which is set in the polyphase inverter power supply 18.

Further, a large number of eddy currents 19 are generated in the plasma P according to the following Maxwell's electromagnetic equation (1) so as to surround the many magnetic fluxes passing in the plasma P. The adjacent eddy currents 19 in the plasma P are offset by each other because the current directions thereof are opposite to each other. Therefore, the total current flows along only the periphery of the plasma P, so that an electric field in one direction is generated as a whole. That is, the induced electric field E is generated in different directions at the front and rear sides of the magnetic field respectively while surrounding the magnetic field, and the induced electric field E rotates around the axis 13a vertical to the surface of the semiconductor wafer 13 like the rotation of the magnetic field, whereby a rotating electric field $E_{MAG}$ is generated in the horizontal direction on the surface of the semiconductor wafer 13. Accordingly, in a surface area of the semiconductor wafer 13, the electric field $E_V$ (plasma sheath electric field $E_{sheath}$) is generated in the vertical direction while an electric field $E_H$ comprising an induced electric field $E_{PS}$ by the antenna and a rotating electric field $E_{MAG}$ is generated in the horizontal direction. Therefore, the composite electric field $E_C$ of the electric field $E_H$ and the electric field $E_V$ is generated at a predetermined angle to the surface of the semiconductor wafer 13.

$$rotE = -\partial B/\partial t \qquad (1)$$

As described above, according to the plasma source 10 of this embodiment, the discharge is performed by the plasma generating means 2 using the antenna 14, the matching circuit 15 and the RF power supply 16, whereby the high-density plasma P can be generated over a broad area in the chamber 11.

Further, according to the plasma source 10 of this embodiment, plasma can be generated with no electrode in the chamber 11, that is, by the electrodeless discharge. Accordingly, the electric field $E_V$ which is vertical to the surface of the semiconductor wafer 13 comprises only the plasma sheath electric field $E_{sheath}$ which is produced at the interface of the semiconductor wafer 13 by the plasma itself which is generated by the electrodeless discharge. The plasma sheath electric field $E_{sheat}$ is still smaller than the DC or AC bias electric field, and thus the horizontal rotating electric field $E_{MAG}$ which is larger than the conventional one can be obtained by the horizontal electric field generating means 3 which comprises the polyphase AC magnets 17 and the polyphase AC inverter power supply 18, so that the ratio of the horizontal electric field $E_H$ to the vertical electric field $E_V$ is increased. Accordingly, the intensity and direction of the composite electric field $E_C$ of the horizontal induced electric field $E_H$ and the vertical electric field $E_V$ (that is, the plasma sheath electric field $E_{sheath}$) can be more easily performed by the control means 4, and the velocity and direction of ions in the plasma can be controlled with high precision. The movement of the ions promotes movement of the other plasma constituent particles such as reaction gas, electrons, radicals, etc. in the plasma, and this facilitates the flattening process of the surface of the semiconductor wafer 13, the film formation and etching process in trench grooves, Via holes, and contact holes, and the angle control of the trench grooves, etc.

Next, the method for controlling the velocity and moving direction of the plasma constituent particles such as ions, etc. in the plasma by the control means 4 will be described in more detail.

In general, at the interface with the sheath in the plasma P, the electric field acting on the ions is considered as the composite electric field of the vertical and horizontal electric fields to the surface of the semiconductor wafer 13 as described above. Since the mass of an electron is smaller than that of an ion, it is assumed that the electron moves completely independently of the frequency of electromagnetic wave in order to simplify the description. Here, in this embodiment, only the plasma sheath electric field $E_{sheath}$ contributes to the electric field vertical to the surface of the semiconductor wafer 13 in the composite electric field. On the other hand, in consideration of time variation, both the rotating electric field $E_{MAG} \cos \omega_{MAG} t$ induced by the rotating magnetic field which is applied horizontally to the surface of the semiconductor wafer 13, and the induced electric field $E_{PS} \cos \omega_{rf} t$ generated by the antenna disposed at the outside of the chamber 11 contribute to the electric field horizontal (parallel) to the surface of the semiconductor wafer 13. The angular frequency of the rotating electric field is set to $2\pi \times 400$ Hz.

Vertical electric field: $E_V = E_{sheath}$

Horizontal electric field: $E_H = E_{PS} \cos \omega_{rf} t + E_{MAG} \cos \omega_{MAG} t (\omega_{rf} = 2\pi \times 13.56$ MHz, $\omega_{MAG} = 2\pi \times 400$ MHz)

Composite electric field: $E_C + E_V + E_H = E_{sheath} + E_{MAG} \cos \omega_{MAG} t + E_{PS} \cos \omega_{rf} t$ (2)

Here, since the mass of the ion in the plasma is smaller than that of the electron, the moving distance of the ion under the RF electric field $E_{PS}$ (13.56 MHz) which is induced by the antenna 14 is extremely shorter than that in the rotating electric field $E_{MAG}$ which is induced by the rotating magnetic field. Considering this face more specifically, the intensity of the RF electric field $E_{PS}$ induced by the antenna 14 is equal to about 10V/5 mm in the plasma sheath (width: 0.5 mm), and the intensity of the rotating electric field $E_{MAG}$ induced by the rotating magnetic field is equal to about 0.375V/mm. The moving distance of ions under each electric field can be calculated on the basis of the force F acting on the ion under the electric field. The force F acting on the ion can be calculated as the product of the amount of charge and the electric field intensity E as shown in the following equation (3). Further, the force F acting on the ion is also equal to the product of the molecular weight and the acceleration $\alpha$.

$$F = qE = M\alpha \quad (3)$$

Further, on the basis of the above equation, the moving distance L of the ion in the horizontal direction for time t (a half period of the rotating magnetic field) is represented as follows:

$$L_H = (\tfrac{1}{2}) \cdot \alpha t^2 = (\tfrac{1}{2})(qE/M) t^2 \quad (4)$$

Here, the time t is equal to $(\tfrac{1}{2})(\tfrac{1}{13.56}$ MHz) sec for the RF electric field $E_{PS}$ (13.56 MHz), and to $(\tfrac{1}{2})(\tfrac{1}{400}$ MHz) sec for the rotating electric field $E_{MAG}$ (400 Hz) based on the rotating magnetic field. Accordingly, from the equation (4), for example, the moving distances $L_{Hrf}$, $L_{HMAG}$ of $CF_4^+$ ion in the horizontal direction at the frequencies of the RF electric field and the rotating electric field respectively are equal to $1.49 \times 10^{-6}$ m and 464.98 m. That is, under the RF electric field, $CF_4^+$ ion moves at a distance of $\mu m$ order, however, under the rotating electric field of about 400 Hz, it moves at a distance of m order. This is because the mass of the ion is larger than that of the electron and its responsibility is lower as the frequency of the electric field is higher. In order to simplify the calculation, it is assumed that the ion concerned does not impinge against other molecules and ions during the moving of the ion, and the molecular weight of the $CF_4^{30}$ ion is set to $1.462 \times 10^{-25}$ Kg.

As described above, it is understood that the effect of the rotating electric field $E_{MAG}$ on the moving of ions more dominantly contributes to the moving distance of the ions in plasma as compared with the effect of the RF electric field $E_{PS}$. As a result, by suitably setting the rotating frequency of the rotating magnetic field to induce the rotating electric field in the control means 4 shown in FIG. 2, the intensity and direction of the composite electric field $E_C$ of the horizontal electric field $E_H$ and the vertical electric field $E_V$ (plasma sheath electric field $E_{sheath}$), that is, the velocity and direction of ions in plasma can be controlled with high precision. Therefore, an incident angle of ions, electrons or the like to the surface of the semiconductor wafer 13 can be freely controlled.

Next, a second embodiment according to the present invention will be described.

Figure 7:
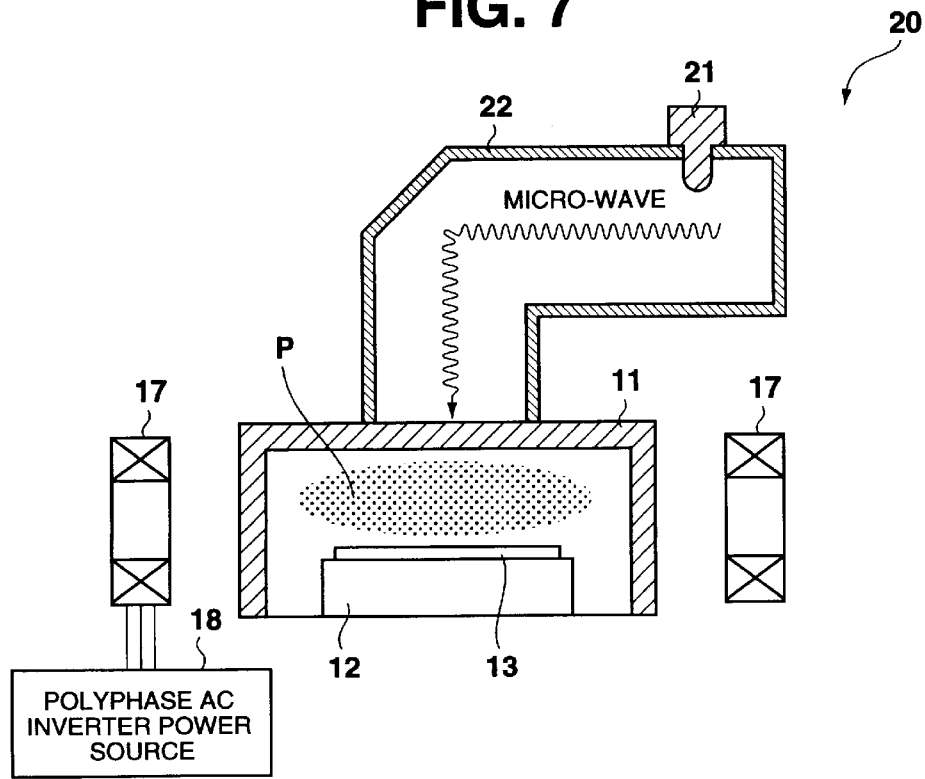
FIG. 7 is a diagram showing the construction of a plasma source according to a second embodiment of the present invention.

FIG. 7 shows the construction of a plasma source 20 according to a second embodiment of the present invention. According to the second embodiment, as the plasma generating means 2, an induced electric field is generated by electrodeless discharge using micro-wave, and plasma is generated by using the induced electric field. The same elements as shown in FIG. 3 are represented by the same reference numerals, and the description thereof is omitted.

The plasma source 20 of this embodiment includes a magnetron 21 which is disposed at the outside of the chamber 11 and serves to generating micro-wave (frequency of 2.45 GHz), and a wave guide 22 for guiding the micro-wave generated by the magnetron 21 into the chamber 11. The other construction is identical to that of the first embodiment, and the description thereof is omitted.

With the plasma source 20, high-density plasma P is also generated in the chamber 11 by the micro-wave generated from the magnetron 21 as in the case of the plasma source 10 of the first embodiment. Further, as in the case of the first embodiment, the horizontal magnetic field is generated on the surface of the semiconductor wafer 13 by the horizontal electric field generating means 3 (see FIG. 2) comprising the polyphase magnets 17 and the polyphase AC inverter power supply 18, and the magnetic field thus generated is rotated to induce the horizontal rotating electric field $E_{MAG}$. Therefore, the effect is the same as the first embodiment.

In the second embodiment, since the magnetic field which is based on the polyphase AC magnets 17 disposed at the outside of the chamber 11 is generated in the plasma, an Electron Cyclotron Resonance phenomenon (ECR) in which electrons in plasma have circular motions. By using this phenomenon, the ionizing efficiency is further enhanced, and higher density plasma can be obtained as compared with the above embodiments.

Figure 8:
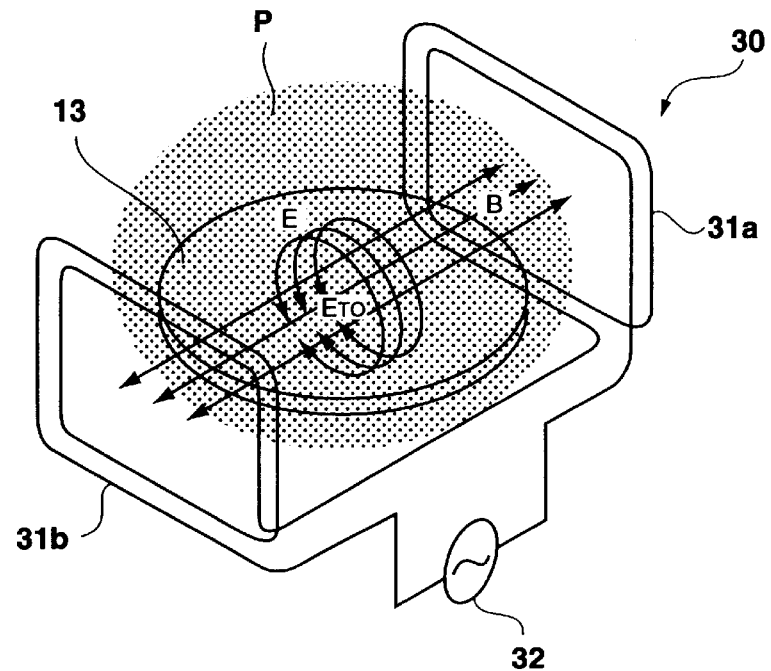
FIG. 8 is a diagram showing the construction of a main part of a plasma source according to a third embodiment of the present invention.

FIG. 8 shows the construction of a main part of a plasma source 30 according to a third embodiment of the present invention. In this embodiment, a method of inducing the horizontal electric field by a reversed magnetic field is used as the horizontal electric field generating means 3 show in FIG. 2. Further, the control means 4 is designed to control the reversing period of the reversed electric field which is induced by the reversed magnetic field. The same elements as shown in FIG. 3 are represented by the same reference numerals, and the description thereof is omitted.

The plasma source 30 according to this embodiment includes a pair of coils 31a, 31b which are disposed at the outside of the chamber 11 so as to confront each other, and a single-phase AC power supply 32 for supplying AC current of predetermined period (several tens Hz to several KHz) to the coils 31a, 31b. The other construction of this embodiment is identical to that of the first embodiment.

In the plasma source 30 thus constructed, when the AC current (several tens Hz to several KHz) is supplied to the coils 31a, 31b, a magnetic field (magnetic flux density B) which is horizontal (parallel) to the surface of the semiconductor wafer 13 is generated in plasma P, and the direction of the magnetic field thus generated is reversed periodically. Further, an induced electric field E is generated so as to surround the magnetic field, and the induced electric field E is also reversed in synchronism with the reversal of the magnetic field. Accordingly, the horizontal electric field $E_{TO}$ is periodically reversed on the surface of the semiconductor wafer 13. Therefore, by combining the vertical electric field $E_V$ (plasma sheath electric field) with the horizontal electric field $E_H$ (=$E_{PS}$+$E_{TO}$) comprising the electric field $E_{TO}$ and the RF electric field $E_{PS}$ generated by the antenna 14, the direction of the composite electric field $E_C$ (see FIG. 3) can be reversed at a desired angle. Therefore, the same effect as the first embodiment can be obtained in this embodiment.

Figure 9:
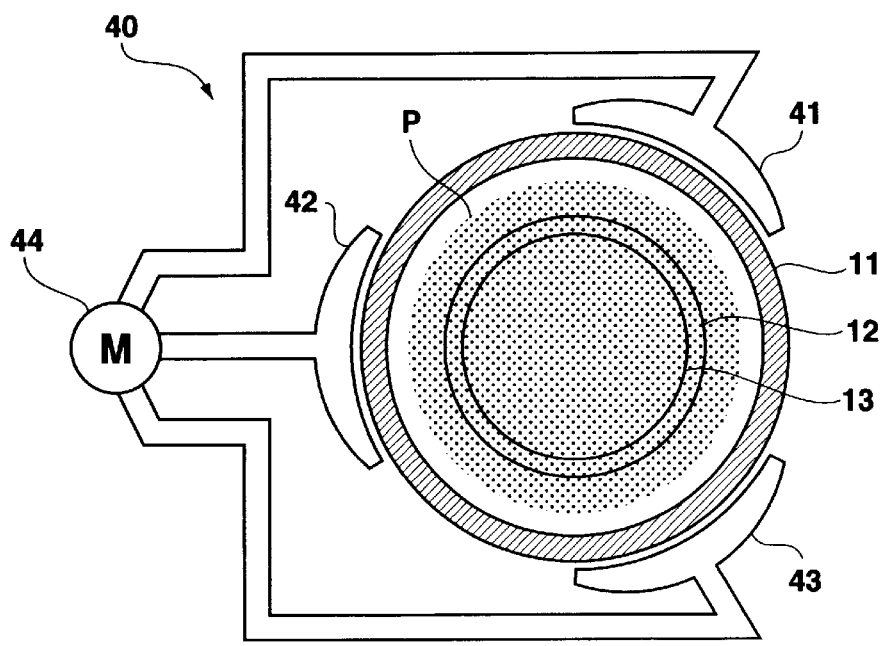
FIG. 9 is a diagram showing the construction of a main part of a plasma source according to a fourth embodiment of the present invention.

FIG. 9 shows the construction of a main part of a plasma source 40 according to a fourth embodiment of the present invention.

Unlike the first embodiment utilizing the rotating magnetic field to induce the rotating electric field, this embodiment uses a method of directly inducing the horizontal rotating electric field by using no rotating magnetic field for the horizontal electric field generating means 3 shown in FIG. 3. Further, the control means 4 is designed to directly control the rotational period of the rotating electric field. The same elements as shown in FIG. 3 are presented by the same reference numerals, and the description thereof is omitted.

According to the plasma source 40 of this embodiment, the horizontal electric field generating means 3 comprises plural wave guides 41 to 43 which are disposed at predetermined intervals along the outer peripheral portion of the chamber 11, and a three-phase magnetron 44 for supplying through the wave guides 41 to 43 micro-waves which have the same frequency and different phases (for example, they are different in phase by 120 degrees).

Figure 11:
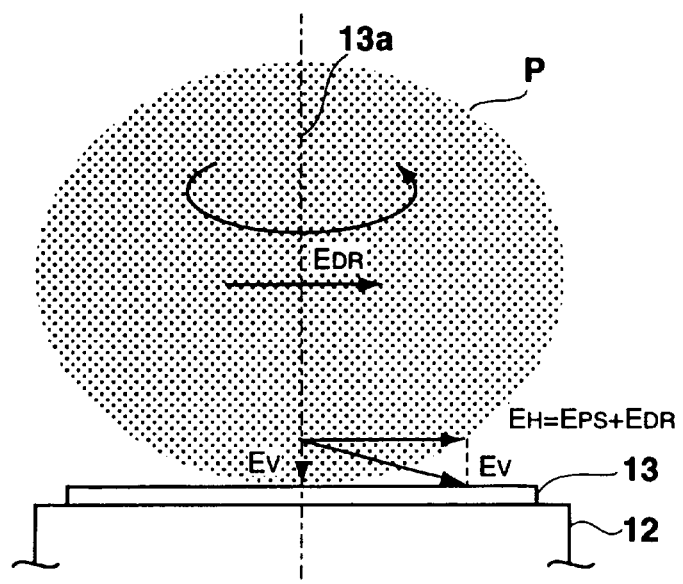
FIG. 11 is a diagram showing generation of a horizontal electric field in the plasma source shown in FIG. 9.

In the plasma source 40 of this embodiment, the microwaves which have the same frequency, but different phases from one another are supplied through the respective wave guides 41 to 43 from the three-phase magnetron 44, whereby a rotating electric field E ($E_{DR}$) which is horizontal (parallel) to the surface of the semiconductor wafer 13 is generated in the plasma in the chamber 11 as shown in FIG. 11. Accordingly, by combining the vertical electric field $E_V$ (plasma sheath electric field) with the horizontal electric field $E_H$ ($E_{DR}$+$E_{PS}$) which is obtained by adding the electric field $E_{DR}$ with the RF electric field $E_{PS}$ generated by the antenna 14, the direction of the composite electric field $E_C$ can be rotated at a desired angle.

In this embodiment, the control means 4 may directly control the rotational frequency of the rotating electric field, whereby the same effect as the first embodiment can be obtained.

Figure 10:
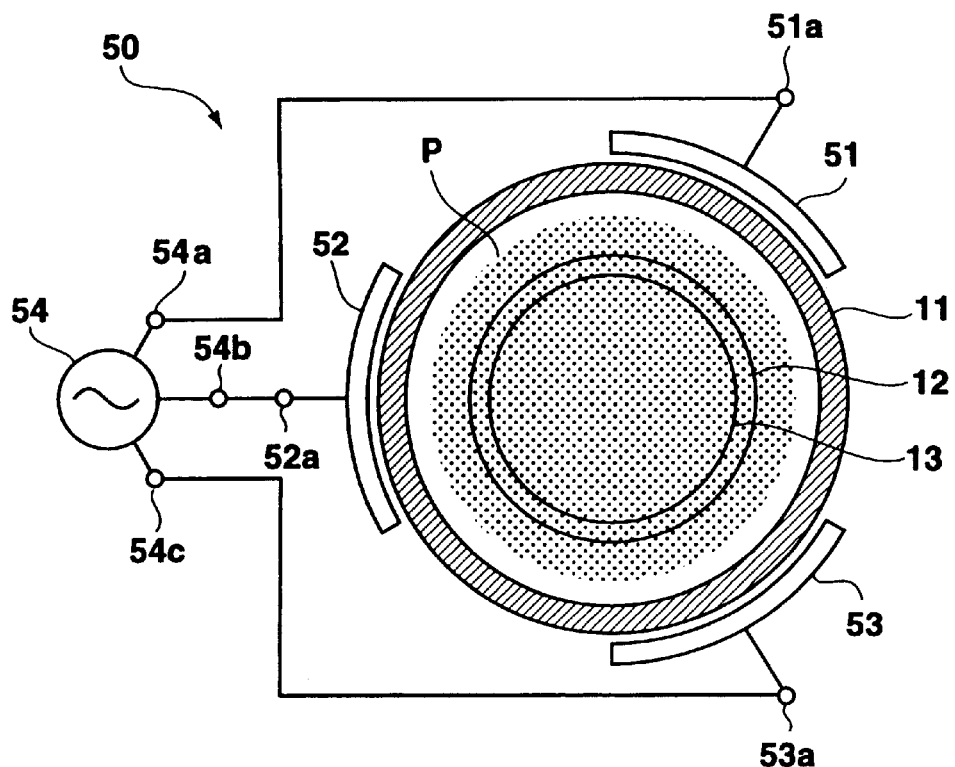
FIG. 10 is a diagram showing the construction of a main part of a plasma source according to a fifth embodiment of the present invention.

FIG. 10 shows the construction of a main part of a plasma source 50 according to a fifth embodiment. According to this embodiment, a high frequency power supply for phase-varying the frequency of the output voltage is used in place of the three-phase magnetron 44 shown in FIG. 9.

In the plasma source 50 of this embodiment, the horizontal electric field generating means 3 shown in FIG. 2 comprises plural (for example, three) electrodes 51 to 53 which are disposed at a predetermined interval along the outer peripheral portion of the chamber 11, and a high frequency power supply (for example, frequency of 13.56 MHz) 54 for supplying each of the electrodes 51 to 53 high frequency power which is invariable in frequency (i.e., the high frequency power of the same frequency is supplied to the electrodes 51 to 53), but variable in phases among the electrodes 51 to 53 (for example, the power which is varied in phase by every 120 degrees is applied to each of the electrodes). The three terminals 54a to 54c of the high frequency power supply 54 are connected to respective terminals 51a to 53a of the electrodes 51 to 53 which are disposed around the chamber 11.

In the above-described plasma source 50, the high frequency power which is invariable frequency, but variable in phase among the electrodes is supplied to each of the respective electrodes 51 to 53 by the high frequency power supply 54, whereby the rotating electric field E ($E_{DR}$) is generated in the direction horizontal to the surface of the semiconductor wafer 13 in the plasma P in the chamber 11 as shown in FIG. 11. Accordingly, by combining the vertical electric field $E_V$ (plasma sheath electric field) and the horizontal electric field $E_H$ ($E_{DR}$+$E_{PS}$) which is obtained by adding the electric field $E_{DR}$ with the high frequency electric field $E_{PS}$ generated by the antenna 14, the direction of the composite electric field $E_C$ can be rotated at a desired angle, as in the case of the fourth embodiment.

The present invention is not limited to the above embodiments, and various modifications may be made to the above-described embodiments within the equivalent scope of the present invention. For example, other methods than described above may be used as the plasma generating means 2 and the horizontal electric field generating means 3.

What is claimed is:

1. A plasma source, comprising:

a processing chamber in which a process target is mounted;

plasma generating means for generating an induced electric field in said processing chamber from an outside of said processing chamber to generate plasma;

horizontal electric field generating means for generating an electric field in a direction horizontal to a surface of a process target in the plasma generated by said plasma generating means, said horizontal field generating means including plural electrodes which are disposed at a predetermined interval along an outer peripheral portion of said processing chamber, and high frequency power supply means for supplying to each of said electrodes high frequency power which is invariable in frequency, but variable in phase around said electrodes to thereby generate a rotating electric field in said processing chamber; and control means for controlling the horizontal electric field generated by said horizontal electric field generating means to control the velocity and moving directions of plasma constituent particles in the plasma.

2. The plasma source as claimed in claim 1, wherein said plasma generating means includes discharging means which is disposed at the outside of said processing chamber and adapted to induce discharge in said processing chamber to generate the induced electric field, and high frequency power supply means for supplying high frequency power to said discharge means.

3. The plasma source as claimed n claim 1, wherein said plasma generating means includes micro-wave generating means disposed as the outside of said processing chamber, and wave guide means for guiding the micro-wave generated by said micro-wave generating means into said processing chamber to generate the induced electric field in said processing chamber.

4. The plasma source as claimed in claim 1, wherein said horizontal electric field generating means includes means for varying the magnetic field to generate an electric field in the direction horizontal to the surface of the process target by the varying magnetic field.

5. The plasma source as claimed in claim 4, wherein said horizontal electric field generating means includes means for rotating the magnetic field to generate a rotating electric field on the basis of the rotating magnetic field, said rotating electric field being in the direction horizontal to the surface of the process target.

6. The plasma source as claimed in claim 5, wherein said horizontal electric field generating means includes a polyphase AC power supply, and polyphase AC magnets which are disposed along the outer peripheral portion of said processing chamber and are supplied with power from said polyphase AC power supply to generate a rotating magnetic field which rotates in the horizontal direction around an axis vertical to the surface of the process target in said processing chamber.

7. The plasma source as claimed in claim 4, wherein said horizontal electric generating means includes means for periodically reversing a direction of the magnetic field to generate an electric field in a direction horizontal to the surface of the process target.

8. The plasma source as claimed in claim 4, wherein said control means includes means for controlling a rate of time variation of the magnetic field which is generated in the horizontal direction to the surface of the process target by said horizontal electric field generating means, thereby controlling the intensity and direction of the composite electric field with the vertical electric field and thus controlling the velocity and moving direction of plasma constituent particles in the plasma.

9. The plasma source as claimed in claim 8, wherein said control means includes means for controlling rotational frequency of a rotating magnetic field which is generated in a direction to the surface of the process target by said horizontal electric field generating means.

10. The plasma source as claimed in claim 8, wherein said control means includes means for controlling reversing frequency of a magnetic field which is generated in a direction horizontal to the surface of the process target by said horizontal electric field generating means.

11. The plasma source as claimed in claim 1, wherein said control means includes means for control rotational frequency of a rotating field which is generated in a direction horizontal to the surface of the process target by said horizontal electric field generating means, whereby the intensity and direction of the composite electric field with the vertical electric field are controlled to thereby control the velocity and moving direction of plasma constituent particles the plasma.

* * * * *